(12) United States Patent
Aizenberg et al.

(10) Patent No.: US 8,084,116 B2
(45) Date of Patent: *Dec. 27, 2011

(54) SURFACES PHYSICALLY TRANSFORMABLE BY ENVIRONMENTAL CHANGES

(75) Inventors: Joanna Aizenberg, New Providence, NJ (US); Thomas Nikita Krupenkin, Warren, NJ (US); Oleksander Sydorenko, Piscataway, NJ (US); Joseph Ashley Taylor, Springfield, NJ (US)

(73) Assignee: Alcatel Lucent, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 11/239,973

(22) Filed: Sep. 30, 2005

(65) Prior Publication Data

US 2007/0077396 A1    Apr. 5, 2007

(51) Int. Cl.
   *B32B 9/04*     (2006.01)
   *G01N 15/06*    (2006.01)
   *G01N 21/00*    (2006.01)
   *G01N 33/53*    (2006.01)
   *H01L 41/08*    (2006.01)

(52) U.S. Cl. ............ 428/119; 117/54; 257/40; 264/134; 359/620; 359/626; 359/665; 359/666; 428/85; 428/98; 428/131; 428/141; 428/413; 428/447

(58) Field of Classification Search ................ 428/119, 428/98, 85, 131, 141, 411, 1, 413, 447; 117/54; 359/620, 626, 665, 666; 257/40; 264/134

See application file for complete search history.

(56) References Cited

U.S. PATENT DOCUMENTS

| | | | |
|---|---|---|---|
| 5,114,676 A | | 5/1992 | Leiner et al. |
| 5,350,966 A | * | 9/1994 | Culp ............................ 310/328 |
| 5,501,893 A | | 3/1996 | Laermer et al. |
| 6,066,911 A | | 5/2000 | Lindemann et al. |
| 6,222,303 B1 | | 4/2001 | Nakamura et al. |
| 6,720,712 B2 | | 4/2004 | Scott et al. |
| 6,802,811 B1 | * | 10/2004 | Slepian ........................ 600/309 |
| 6,864,620 B2 | | 3/2005 | Takeuchi et al. |
| 7,061,161 B2 | | 6/2006 | Scher et al. |
| 7,075,213 B2 | | 7/2006 | Krill |
| 7,106,519 B2 | | 9/2006 | Aizenberg et al. |
| 7,884,530 B2 | | 2/2011 | Aizenberg et al. |

(Continued)

FOREIGN PATENT DOCUMENTS

EP    1 520 622    4/2005

(Continued)

OTHER PUBLICATIONS

PCT International Search Report dated Mar. 2, 2007 in PCT/US2006/037335 (3 pages).

(Continued)

*Primary Examiner* — Brent T O'Hern
(74) *Attorney, Agent, or Firm* — Hitt Gaines, PC

(57) ABSTRACT

An apparatus includes a substrate having a top surface, a substantially regular array of raised structures located over the top surface, and a layer located on the top surface between the structures. Distal surfaces of the structures are farther from the top surface than remaining portions of the structures. The layer is able to contract such that the distal surfaces of the structures protrude through the layer. The layer is able to swell such that the distal surfaces of the structures are closer to the top surface of the substrate than one surface of the layer.

7 Claims, 8 Drawing Sheets

U.S. PATENT DOCUMENTS

| | | | |
|---|---|---|---|
| 2001/0036674 A1* | 11/2001 | Indermuhle et al. | 436/518 |
| 2003/0098632 A1 | 5/2003 | Takeuchi et al. | |
| 2003/0175534 A1* | 9/2003 | Chen et al. | 428/447 |
| 2004/0061104 A1* | 4/2004 | Bao et al. | 257/40 |
| 2004/0173506 A1 | 9/2004 | Doktycz et al. | |
| 2004/0191127 A1 | 9/2004 | Kornblit et al. | |
| 2004/0201324 A1 | 10/2004 | Takeuchi et al. | |
| 2005/0024730 A1* | 2/2005 | Aizenberg et al. | 359/620 |
| 2005/0039661 A1 | 2/2005 | Kornblit et al. | |
| 2005/0042455 A1* | 2/2005 | Gedig et al. | 428/411.1 |
| 2005/0116798 A1* | 6/2005 | Bintoro et al. | 335/78 |
| 2005/0162049 A1 | 7/2005 | Krill | |
| 2005/0178286 A1 | 8/2005 | Bohn, Jr. et al. | 106/10 |
| 2006/0024478 A1* | 2/2006 | D'Urso et al. | 428/156 |
| 2006/0122565 A1 | 6/2006 | Kooi | |
| 2006/0158065 A1 | 7/2006 | Pelrine et al. | |
| 2007/0026193 A1* | 2/2007 | Luzinov et al. | 428/141 |
| 2007/0056853 A1 | 3/2007 | Aizenberg et al. | |
| 2007/0058483 A1 | 3/2007 | Aizenberg et al. | |
| 2007/0059213 A1 | 3/2007 | Aizenberg et al. | |
| 2007/0059488 A1* | 3/2007 | Aizenberg et al. | 428/141 |
| 2007/0237937 A1* | 10/2007 | Aizenberg et al. | 428/221 |
| 2008/0072357 A1* | 3/2008 | Aizenberg et al. | 977/725 |

FOREIGN PATENT DOCUMENTS

| | | |
|---|---|---|
| JP | 2005304212 A | 10/2005 |
| WO | WO 2005046457 A2 * | 5/2005 |

OTHER PUBLICATIONS

Definition for "Support" available at http://dictionary.reference.com/browse/support (2009).

Agarwal, Abhishek K., et al., "Programmable Autonomous Micromixers and Micropumps", Journal of Microelectromechanical Systems, vol. 14, No. 6, Dec. 2005, pp. 1409-1421.

Beebe. David. J. et al., "Functional Hydrogel Structures for Autonomous Flow Control Inside Microfluidic Channels", Nature vol. 404, Apr. 6, 2000, www.nature.com, pp. 588-590.

* cited by examiner

SURFACES PHYSICALLY TRANSFORMABLE BY ENVIRONMENTAL CHANGES

BACKGROUND

1. Field of the Invention

The invention relates generally to apparatus having structured surfaces and methods of making and using such apparatus.

2. Discussion of the Related Art

Conventional micro-fabrication techniques have produced silicon surfaces patterned by regular arrays of high aspect-ratio nanostructures. In exemplary arrays, the nanostructures are vertical posts with heights of between a few micrometers and a few tens of micrometers and diameters of about a micrometer or less. Neighboring ones of the posts are, e.g., separated ten micrometers or less.

These conventional arrays of high aspect-ratio nanostructures can qualitatively modify a substrate's wetting properties with respect to aqueous solutions. An array of such nanostructures can, e.g., cause the surface of silicon substrate to behave as a super hydrophobic surface. A super hydrophobic surface produces a large contact angle to a water droplet located thereon and causes the droplet to be highly mobile. Super hydrophobic surfaces have had a variety of applications.

BRIEF SUMMARY

In one embodiment, an apparatus includes a substrate having a top surface, a substantially regular array of raised structures located over the top surface, and a layer located over the top surface between the structures. Distal surfaces of the structures are farther from the top surface than remaining portions of the structures. The layer is able to contract such that the distal surfaces of the structures protrude through the layer. The layer is able to swell such that the distal surfaces of the structures are closer to the top surface of the substrate than one surface of the layer.

In some embodiments of the apparatus, the layer may include hydrogel and/or distal portions of the structures may intersect an imaginary plane such that said portions occupy less than 10% of the part of the plane located between the structures.

In another embodiment, a method includes transforming a structure from a first state to a second state by changing an environmental condition near a surface of the structure. An array of raised structures is located on the surface. A layer is located on the surface between the structures. Tips of the structures protrude through the layer in one of the states and do not protrude through the layer in the other of the states.

In some embodiments of the method, the layer may be thicker in the other of the states than in the one of the states and/or the layer may include hydrogel.

BRIEF DESCRIPTION OF THE DRAWINGS

In the Figures and text, like reference numerals indicate elements with similar functions.

In various Figures, one or more of linear dimensions of some features may be exaggerated to better illustrate the embodiments.

The illustrative embodiments are described more fully by the Figures and Detailed Description of the Illustrative Embodiments. The inventions may, however, be embodied in various forms and are not limited to the embodiments described in the Figures and the Detailed Description of the Illustrative Embodiments.

DETAILED DESCRIPTION OF THE ILLUSTRATIVE EMBODIMENTS

Various embodiments provide structures whose effective surface can be in two different physical states. The various structures have the advantage of providing a transformable effective surface. The transformations may change physical or selected chemical properties of the effective surface and are reversible in some of the embodiments.

Figure 1:
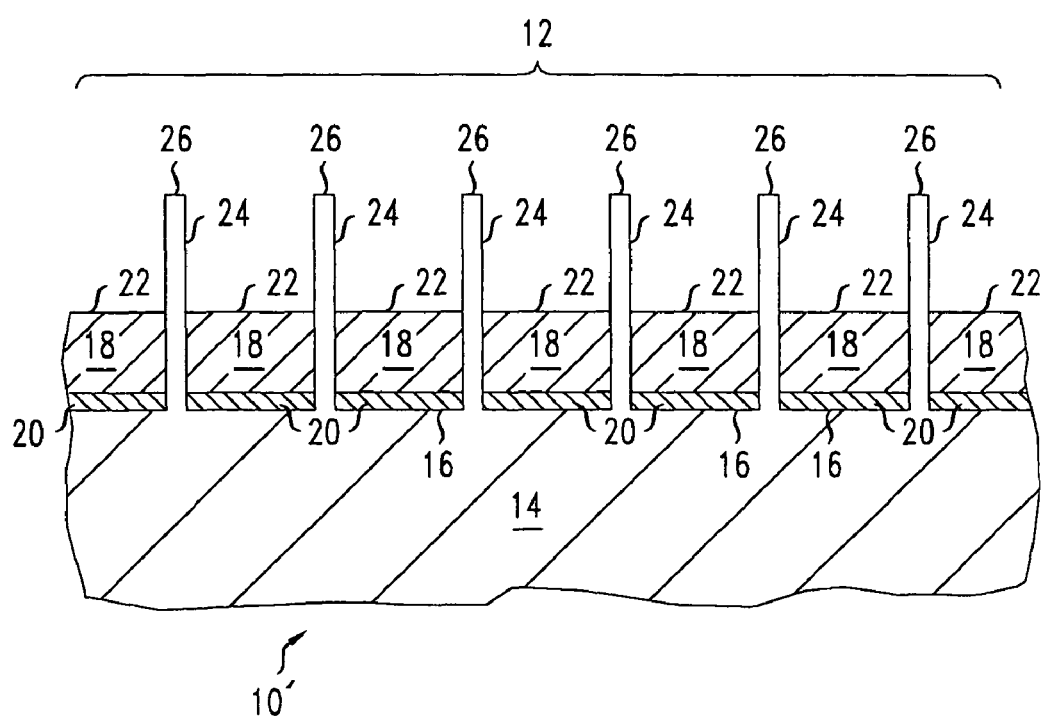
FIG. 1 is a cross-sectional view illustrating the contracted state of an apparatus whose effective surface reversibly transforms responsive to one or more environmental conditions near the effective surface.
Figure 2:
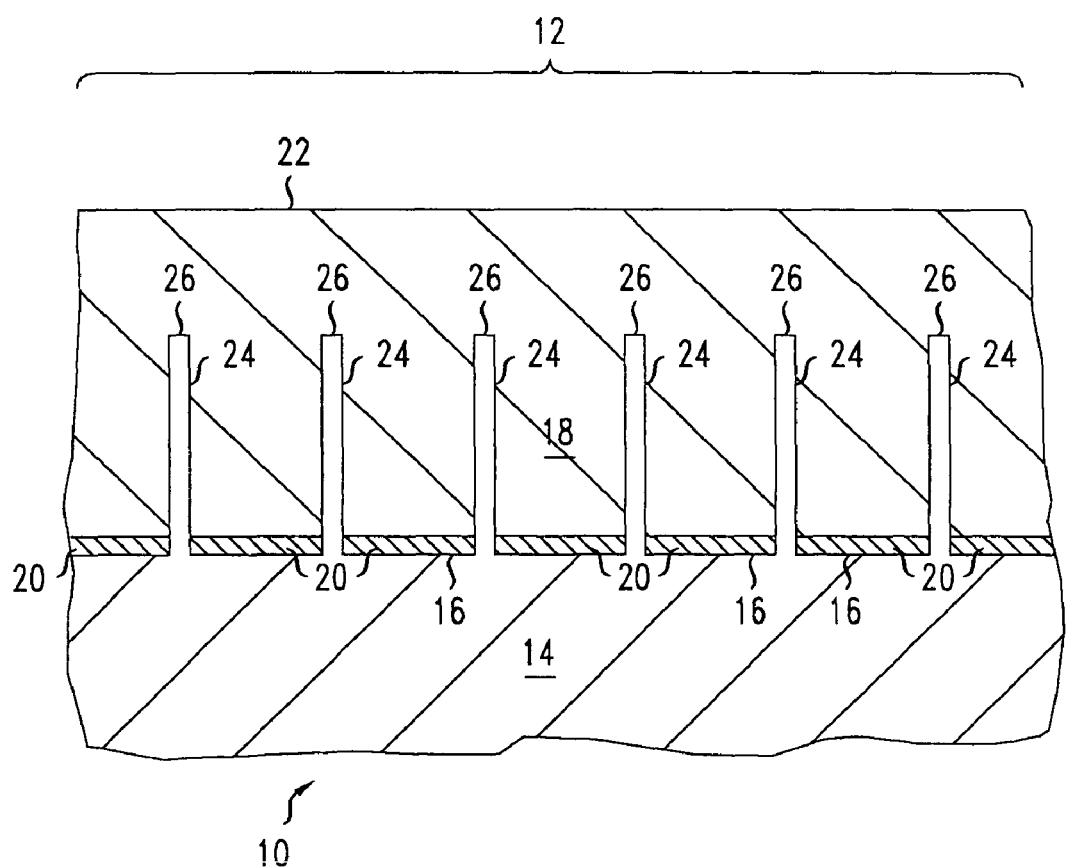
FIG. 2 is a cross-sectional view illustrating the swollen state of the apparatus of FIG. 1.

FIGS. 1-2 illustrate a portion of an apparatus 10 having an effective surface 12 that is exposed to an external environment. The external environment may include a fluid (not shown) resting on or moving over the effective surface 12. The effective surface 12 is able to physically transform in a reversible or irreversible manner that changes its external physical and/or chemical surface properties. Examples of surface properties that may be changed by the transformation include surface wetting properties and/or selected chemical reactivities. The effective surface 12 transforms in response to changes to one or more environmental conditions local thereto. Examples of environmental conditions that may trigger the transformation include humidity level, temperature, illumination level, and concentration of a selected chemical species in a liquid next to the effective surface 12. The chemical species that cause a transformation may, e.g., be organic solvents, hydronium and hydroxide ions, or selected metal ions such as copper (Cu), nickel (Ni), cobalt (Co), or palladium (Pd) ions.

The apparatus 10 includes a substrate 14 having a substantially planar top surface 16 and a layer 18 adhered to the substantially planar surface 16. Examples of the substrate 14 include flat, curved, or bent semiconductor substrates such as silicon wafer-substrates and flat, curved or bent dielectric substrates of silica-type glasses or hard polymeric materials. The layer 18 is capable of swelling and contracting and is typically a cross-linked polymer gel. Exemplary layers 18 are a cross-linked polymer hydrogels. For the layer 18, exemplary hydrogels may include cross-linked polymers of acrylamides such as N-isopropylacrylamide, N,N'-methylenebisacrylamide; cross-linked polymers of tetraethylene glycol dimethacrylate; and/or cross-linked co-polymers such as hydroxyethyl methacrylate-co-methacrylic acid and/or acrylamide-co-2-vinylpyridine.

The layer 18 may have a chemically or physically functionalized free surface 22. In some embodiments, the free surface 22 includes one or more materials that physically modify its surface-wetting or surface-sticking properties, e.g., to change a hydrophilicity of the surface of the layer 18. Examples of such surface-modifying materials include polystyrene, amorphous fluorocarbon polymers such as polytetrafluoroethylene, and polymers with low glass transition temperatures, e.g., polybutylmethacrylate. In other embodiments, the free surface 22 includes one or more materials that provide a selective chemical reactivity to the free surface 22. Examples of such materials include materials that affect the biological activity of the free surface 22, e.g., selected antibody, protein and/or nucleic acid species. The free surface 22 of the layer 18 may be functionalized by any combination of the above surface-modifying and/or chemical-modifying materials.

The substantially planar surface 16 of the substrate 14 also has a substantially regular array of raised micro-structures 24 located thereon. The micro-structures 24 extend substantially perpendicular to the planar surface 16 of the substrate 14. The micro-structures 24 may be vertical or somewhat tilted posts, on-edge or somewhat tilted on-edge plates, or closed-cell structures such as honeycombs or square meshes. Exemplary compositions of the micro-structures 24 include silicon and silicon oxide for a silicon composition of the substrate 14 and electroplated metals such as copper (Cu), nickel (Ni), or cobalt (Co) for various compositions of the substrate 14.

The distal free tips 26 of the micro-structures 24 may impart desirable physical and/or chemical properties to the effective surface 12. For example, the micro-structures 24 or free tips 26 thereof may be made of or coated with a hydrophobic material and/or be fabricated so that the array of micro-structures 24 produces a super hydrophobic surface to a liquid located on the array. On a super hydrophobic surface, water droplets have large contact angles and high mobilities. To produce a super hydrophobic surface, the distal tips 26 of the micro-structures 24 should occupy only a small part of an imaginary plane 28 passing through the tips 26. For example, the distal tips 26 may cover less than 25%, less than 10%, or even 3% or less of the area of said plane that is located over the array and between the tips 26. To produce a super hydrophobic surface, it is also desirable for the micro-structures 24 to have a large aspect-ratio, wherein the aspect-ratio is structure's height over the structure's minimum lateral feature width. A high aspect-ratio ensures that fluctuations of the surface of a liquid supported on the distal tips 26 will not cause the liquid to substantially physically interact with lower portions of the apparatus 10 such as the layer 18. Strong physical interactions with the underlying layer 18 could significantly reduce ability of the effective surface 12 to be super hydrophobic. To have the above-described properties, an exemplary array may have post-like micro-structures 24 with heights of 4 micrometers (μm) to 20 μm, diameters of 0.1 μm to 1 μm, and nearest-neighbor separations of 0.5 μm to 10 μm.

The volume between individual ones of the micro-structures 24 is, at least, partially filled by layer 18. Indeed, a thin anchoring layer 20 may covalently bond the layer 18 to the substrate 14. Adhesion between the layer 18 and underlying material ensures that, at least, part of the layer 18 fills the volume located between the micro-structures 24.

The layer 18 and apparatus 10 have a contracted state, as illustrated in FIG. 1, and a swollen state, as illustrated in FIG. 2. In the contracted state, the layer 18 only partially fills the volume between individual ones of the micro-structures 24. In the contracted state, distal tips 26 of the micro-structures 24 protrude through the thickness of the layer 18, e.g., by 1 μm or more and typically by 4 μm or more. For that reason, the properties of array of micro-structures 24 substantially define the properties of the effective surface 12 when the layer 18 is in the contracted state. For example, the surface 12 is super hydrophobic if the array of the distal tips 26 forms a super hydrophobic surface. In the swollen state, the layer 18 completely fills the volume between individual ones of the micro-structures 24 and typically extends farther from the top surface 16 of substrate 14 than the distal tips 26. In the swollen state, the distal tips 26 of the micro-structures 24 do not protrude through the free surface 22 of the layer 18. For that reason, properties of the free surface 22 of the layer 18 substantially define those of the effective surface 12 when the layer 18 is in the swollen state.

The apparatus 10 physically transforms between the contracted and swollen states responsive to modifications to the local environment of its effective surface 12. Thus, the availability of contracted and swollen states for the layer 18 provides a physical functionality to the effective surface 12. Indeed, the layer 18 may swell or contract in response to changes of a variety of local environmental conditions. For example, some embodiments form the layer 18 or a hydrogel that swells and contracts in response to temperature changes. Such temperature-sensitive hydrogels include polymers of N-isopropylacrylamide and/or N,N'-methylenebisacrylamide. Hydrogels of such polymers may be able to swell by about five times or more as the temperature is lowered from above 32° C. to below 32° C. Alternately, some embodiments form the layer 18 of a hydrogel that swells and contracts significantly in response to variations in the pH of a liquid layer located next to the hydrogel. Examples of pH-sensitive hydrogels include polymers of hydroxyethyl methacrylate-co-methacrylic acid and tetraethylene glycol dimethacrylate. Alternately, some embodiments form the layer 18 of a hydrogel that swells and contracts significantly in response to changes of a metal ion concentration in a liquid layer located next to the hydrogel, e.g., a variation in a Cu, Ni, Co, and Pd ion concentration. Examples of such metal ion-sensitive hydrogels include polymers of acrylamide-co-2-vinylpyridine and N,N'-methylenebisacrylamide. Various embodiments of the layer 18 may include any of the above hydrogels.

Figure 3:
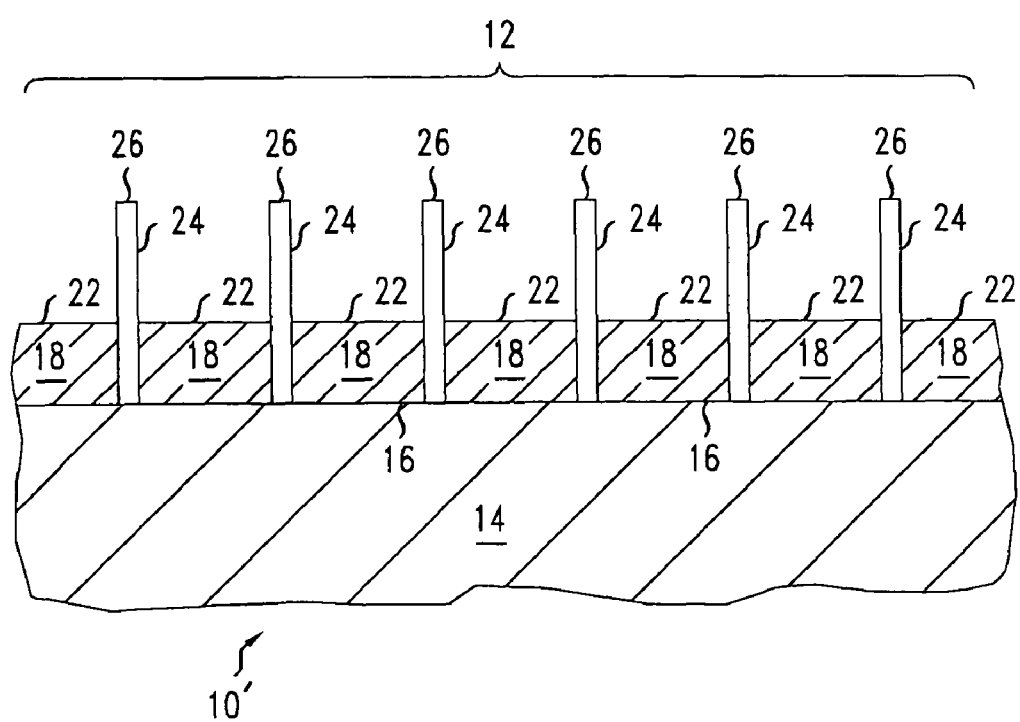
FIG. 3 is a cross-sectional view illustrating the contracted state of an alternate apparatus whose effective surface reversibly transforms responsive to one or more environmental conditions near the effective surface.
Figure 4:
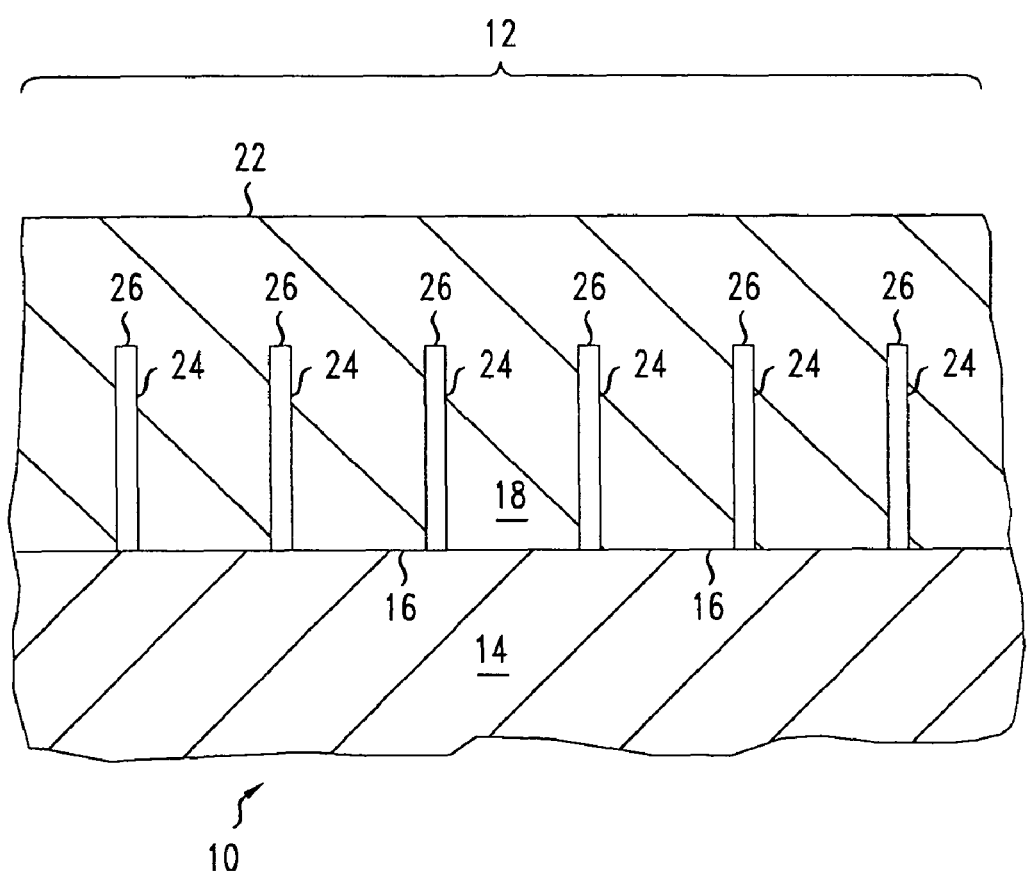
FIG. 4 is a cross-sectional view illustrating the swollen state of the apparatus of FIG. 3.

FIGS. 3-4 illustrate an alternate embodiment for an apparatus 10' whose effective surface 12 physically transforms in response to changes to one or more selected local environment conditions. Local environmental conditions that transform the effective surfaces 12 of various embodiments of the apparatus 10' may include humidity level, pH, temperature, illumination level, and/or local concentration of a selected species of dissolved ions, e.g., metal ions.

The apparatus 10' includes a substrate 14, a layer 18, and a regular array of raised micro-structures 24 as in the apparatus 10 of FIGS. 1-2. The layer 18 transforms in response to changes to one or more selected local environmental conditions. In particular, the layer 18 may contract in thickness to the contracted state of FIG. 3 or swell in thickness to the swollen state of FIG. 4 in response to such a local environmental change. The layer 18 may have one of the compositions already described for the layer 18 of FIGS. 1-2, e.g., a hydrogel. The layer 18 has a free surface 22 that may be physically or chemically functionalized, e.g., to modify wetting or sticking properties and/or to modify a surface-chemical reactivity as described with respect to the layer 18 of FIGS. 1-2. The micro-structures 24 have, e.g., one of the compositions already described for micro-structures 24 of FIGS. 1-2. The distal free tips 26 of the micro-structures 24 may also be physically or chemically functionalized, e.g., to modify their wetting or sticking properties and/or to modify their chemical reactivity as for the distal free tips 26 of the micro-structures of FIGS. 1-2.

In the apparatus 10', the transformable layer 18 adheres directly to the substantially planar top surface 16 of the substrate 14 rather than being bonded thereto by an additional anchoring layer as in FIGS. 1-2. The transformable layer 18 may adhere to the top surface 16 through chemical forces that include but are not limited to covalently bonding.

Figure 5:
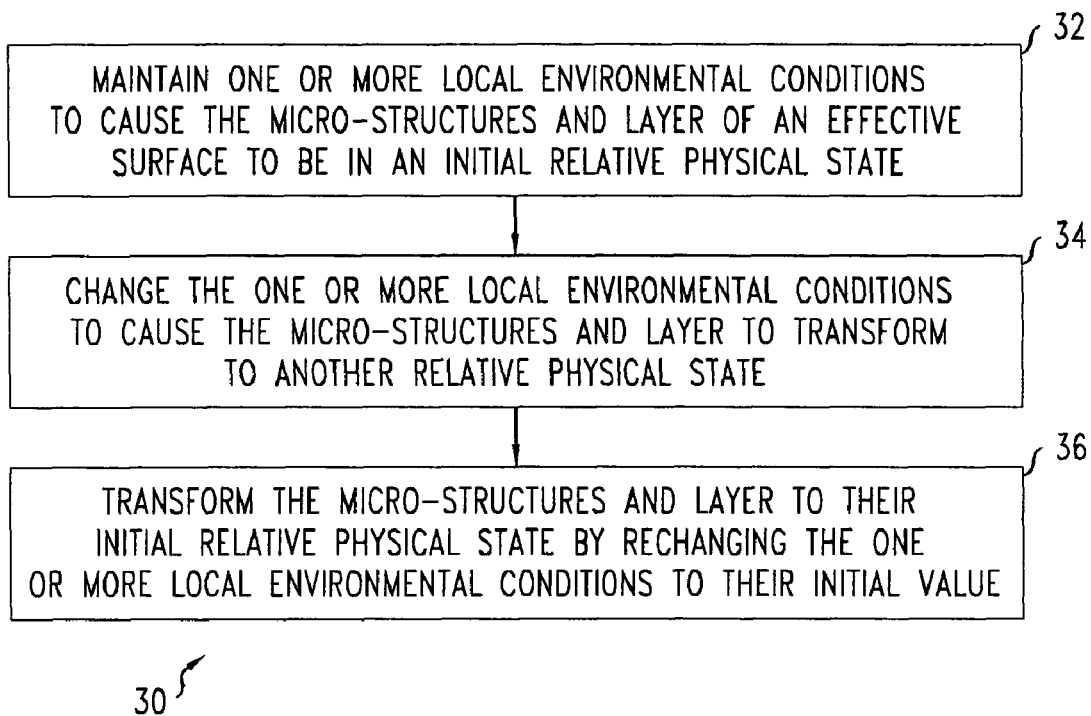
FIG. 5 is a flow chart illustrating a method of operating an apparatus with a physically transformable effective surface.

FIG. 5 illustrates a method 30 for operating a layered structure whose effective surface has transformable properties, e.g., effective surface 12 of FIGS. 1-2 or FIGS. 3-4. The layered structure includes an array of raised structures, e.g., micro-structures 24, on the surface of a substrate, e.g., the top surface 16 of substrate 14. The layered structure also includes a layer, e.g., layer 18, which may include hydrogel. The layer is located over the surface of the substrate and between the structures of the array, e.g., adhered to the surface of the substrate.

The method 30 includes maintaining one or more environmental conditions local to the effective surface to cause the effective surface to be in a selected initial physical state (step 32). Exemplary environmental conditions may include the humidity level, a temperature, an illumination level, and/or level of acidity or a concentration of dissolved metal ions in a liquid located next to the effective surface.

The effective surface has first and second physical states. In the first physical state, as illustrated in FIG. 1 or 3, distal free tips of an array of raised structures protrude through the layer. Thus, the distal tips protrude into the external environment near the effective layer and can substantially define the physical and chemical properties of the effective surface in the first physical state. In the second physical state, as illustrated in FIG. 2 or 4, the distal free tips of the raised structures do not protrude through the layer and may even be located deep below the free surface of said layer. In the second state, the layer may be thicker than in the first state, e.g., as illustrated by comparing FIGS. 2 and 1 or by comparing FIGS. 4 and 3. Thus, the free surface of the layer is in the nearby external environment and can substantially define the physical and chemical properties of the effective surface in the second physical state. The two different physical states of the effective surface can provide the effective surface with different external physical and/or external chemical properties in these two states.

The method 30 includes transforming the structure from the selected initial physical surface state to another physical surface state by changing the one or more environmental conditions near the effective surface of the structure (step 34). For example, the changed one or more environmental conditions may cause the layer to swell or contract with respect to its initial state in step 32.

In various embodiment, the transforming step exploits the dramatic response of the material of the layer to changes to the one or more environmental conditions to produce the state change. For example, the layer may be formed substantially of hydrogel. Some hydrogels change in volume by a factor of about five or more in response to a change in humidity, temperature, acidity, illumination, and/or a concentration of dissolved ions.

The transforming step may change a physical property of the effective surface such as its hydrophobicity and/or a selected chemical reactivity of the effective surface such as a biological activity.

The method 30 may include retransforming the structure to its initial physical surface state by rechanging the values of the one or more environmental conditions near the effective surface back to their initial values in step 32 (step 36). Such a retransforming step is possible when the layer is able to swell and contract reversibly. The retransforming step may, e.g., cause the layer, which swelled above tips of the structures during step 34, to re-contract so that the tips of the structures of the array again protrude through the layer into the external environment. After step 36, the effective surface may have its initial physical and/or chemical properties.

Figure 6:
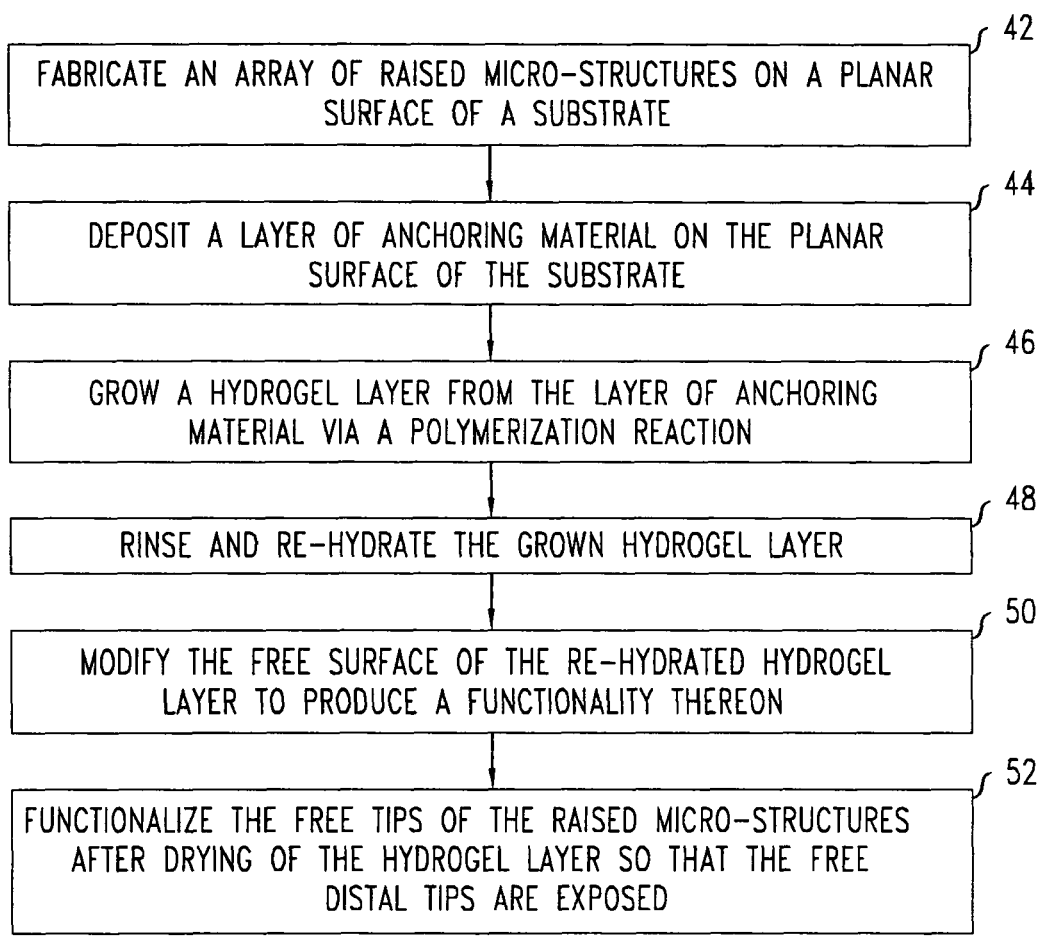
FIG. 6 is a flow chart illustrating a method of fabricating embodiments of apparatus with physically transformable effective surfaces, e.g., the apparatus of FIGS. 1-2.

FIG. 6 illustrates an exemplary method 40 for fabricating an apparatus with an environmentally transformable surface, e.g., apparatus 10 of FIGS. 1-2.

First, the method 40 involves fabricating a regular array of raised micro-structures on a planar surface of a substrate, e.g., micro-structures 24 on substrate 14 as in FIGS. 1-2 (step 42). The raised micro-structures may be nearly vertical posts, nearly on-edge planes, or closed-cell structures such as a honeycomb or square mesh structures. The substrate may be a silicon wafer-substrate or an inorganic or organic planar dielectric substrate. The fabrication of the raised micro-structures may involve performing a conventional dry or wet etch of the surface of the substrate under the control of a mask or may involve performing a material deposition or growth under the control of a mask. The fabrication may alternatively involve the replication of such an array of raised micro-structures in a polymer, i.e., to form a polymer replica.

Second, the method 40 involves depositing a thin layer of anchoring material on the substrate that has been already patterned by the array of raised micro-structures (step 44). The layer of anchoring material covalently bonds to the substrate and is capable of covalently bonding to a selected hydrogel. The depositing of the layer of anchoring material may also require performing a separate activation step that changes the layer so that a selected hydrogel can be directly deposited or grown on the anchoring material.

An exemplary depositing step involves immersing a surface of a silicon wafer-substrate with a solution of 1-2 weight % of the epoxide poly(glycidylmethacrylate) (PGMA) in a 2-butanone solvent. The surface of the silicon wafer-substrate is kept in the solution for about 30 minutes at room temperature to allow the PGMA to adsorb onto the surface. Then, the surface is abundantly rinsed with 2-butanone to remove unattached polymer, e.g., leaving an adsorbed layer of about 1-2 nanometers of PGMA. Finally, the surface and adsorbed PGMA are stored for a time sufficient to produce covalent bonding between glycidyl groups of the PGMA and silanol groups on the silicon surface. Exemplary times are about 1 hour when the reaction proceeds at about 100° C. and overnight when the reaction proceeds at room temperature.

To enable the direct growth of hydrogel from the anchoring layer, an additional activation step is performed. An exemplary activation step includes immersing the PGMA coated silicon surface in a 1 weight % aqueous solution of acrylic acid for about 20 minutes at room temperature. The acrylic acid reacts with remaining glycidyl groups of the PGMA to graft acrylic acid groups onto the PGMA by the formation of ester bonds. A subsequent polymerization reaction will propagate from the grafted acrylic groups (as described below). The acrylic acid reaction may also make the anchoring material more hydrophilic.

A description related to forming a layer of anchoring material is given in U.S. Patent Publication No. 2004185260, published Sep. 23, 2004 for U.S. application Ser. No. 10/773,120, which was filed Feb. 5, 2004. This published patent application is incorporated herein by reference in its entirety.

Third, the method 40 includes growing a hydrogel layer from the layer of anchoring material via a polymerization reaction (step 46). To start the growth, a film of starting solution is coated onto the surface, e.g., the surface that has been prepared with an anchoring layer of activated PGMA layer as described above. An exemplary aqueous starting solution has about 40 weight % acrylamide monomers, about 0.5 weight % methylenebisacrylamide cross-linker molecules, about 0.5 weight % of a viscosity agent such as poly (acrylic acid), and about 1-4 weight % of free radical initiators such as ammonium persulfate. The growth is preferably performed in a confined region to reduce surface tension forces that may inhibit polymer growth directly from the anchoring layer. To produce a confined region, a flat poly (dimethylsiloxane) (PDMS) plate or ordinary glass slide may be pressed against the distal tips of the array of raised micro-structures after the surface has been coated with the starting solution. A pressure of about 100 Newtons per centimeter squared can maintain the PDMS plate or glass slide in contact with the raised micro-structures during the growth thereby maintaining the confined region. In the confined region, the reaction tends to grow the polymer molecules of hydrogel directly from the activated PGMA anchoring layer. To produce a hydrogel layer with a thickness of a few micrometers from the above-described starting solution, the polymerization reaction may be performed for about an hour at 50° C. Of course, the time for the polymerization reaction will vary with the desired thickness of the final hydrogel layer.

Fourth, the method 40 includes rinsing and re-hydrating the produced hydrogel layer (step 48). The rinse removes unreacted monomers and cross-linker molecules from the solution remaining on and in the structure. For the above-described starting solution, the rinse may be performed with distilled water at standard temperature for an hour or more. The rinsing can also re-hydrate and swell the resulting hydrogel layer, e.g., so that tips of the raised micro-structures do not protrude from the re-hydrated hydrogel layer.

Fifth, the method 40 may optionally include modifying the free surface of the re-hydrated hydrogel layer to provide said surface with a selected physical, chemical, or biological functionality (step 50). The selected chemical functionality will define the properties of the effective surface of the resulting apparatus when the hydrogel layer is in the swollen state.

Some such modification steps change the physical surface properties of the hydrogel layer. Such a surface modification step may involve depositing a thin amorphous layer of a polyfluorocarbon similar to a poly(tetrafluoroethylene) (PTFE) on the free surface of the hydrogel layer, e.g., via a chemical vapor deposition process. Alternately, the surface modification step may involve solution depositing polystyrene (PS), poly(n-butyl methacrylate) or another polymer onto the re-hydrated hydrogel layer to provide the hydrogel layer with a desired wettability to aqueous solutions.

Other such modification steps change the chemical surface properties of the hydrogel layer. Such a surface modification step may involve fixing biological molecules to the re-hydrated hydrogel layer's surface molecules. Examples of such molecules include selected antibodies, proteins or enzymes, DNA or oligonucleotides.

Sixth, the method 40 may optionally include functionalizing the free distal tips of the raised micro-structures after drying of the hydrogel layer so that the free distal tips are exposed (step 52). This functionalization may provide the free tips with a selected physical, chemical, and/or biological functionality.

Exemplary functionalization steps for the free distal tips of the raised micro-structures involve first, cleaning the exposed free distal tips and then, bonding a material to the cleaned free distal tips to produce the desired functionality.

To clean the free tips, the partially fabricated apparatus is subjected to a treatment that removes hydrogel from the free distal tips of the raised micro-structures. In particular, thin hydrogel layer may be formed on the free tips during the growth of the hydrogel layer at step 46. Exemplary cleaning treatments involve performing a plasma etch, e.g., a reactive ion etch based on either oxygen or argon, to remove a thin hydrogel layer.

Producing the desired functionality on the cleaned free tips involves performing one of a plurality of surface treatments to deposit a material thereon.

One exemplary surface treatment involves performing a chemical vapor deposition (CVD) of fluorocarbon polymer on the free tips of the raised micro-structures. For silicon micro-structures, the conditions for the deposition may include a gas mixture of $CHF_3$ and argon (Ar), a gas flow of less than 100 sccm, a pressure of $10^{-5}$-$10^{-4}$ bars, and a microwave energy of 300-1200 watts at 2.45 GHz to generate a plasma for the CVD process. Exemplary methods for forming uniform layers of such fluorocarbon polymers are described in U.S. Pat. No. 5,501,893, issued Mar. 26, 1996 to F. Laermer et al ('893 patent), which is incorporated by reference herein in its entirety.

Another exemplary surface treatment involves forming a self-assembling monolayer (SAM) on the free distal tips of the raised micro-structures. For silicon micro-structures, formation of the SAM may include immersing the dried effective surface in a solution of about 1 weight % of the selected silane compound in toluene. An exemplary silane compound is octadecyltrichlorosilane. The immersion is performed over long enough time for the silane molecules to both bond the silane compound to the silicon surface of the free tips of the micro-structures and to bond the molecules of the compound together thereby forming the SAM. For example, a ½ hour immersion at room temperature may be long enough. Other embodiments may use a SAM that is formed of a different silane compound.

In other embodiments, the temporal order of steps 50 and 52, i.e., the steps that functionalize the free surface of the hydrogel layer and the free tips of the micro-structures, may be inverted.

Figure 7A:
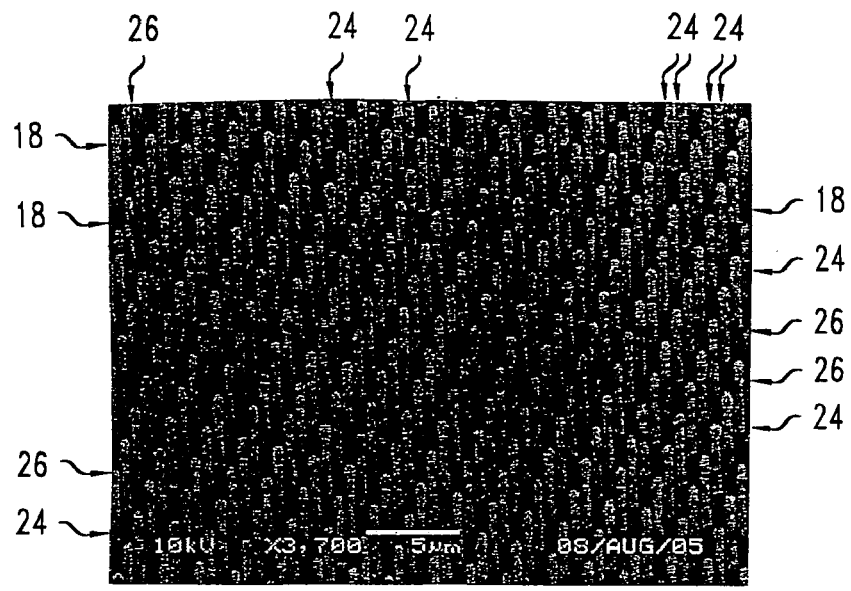
FIGS. 7A-7C are scanning electron micrographs of various embodiments of apparatus made according to the method of FIG. 6.
Figure 7B:
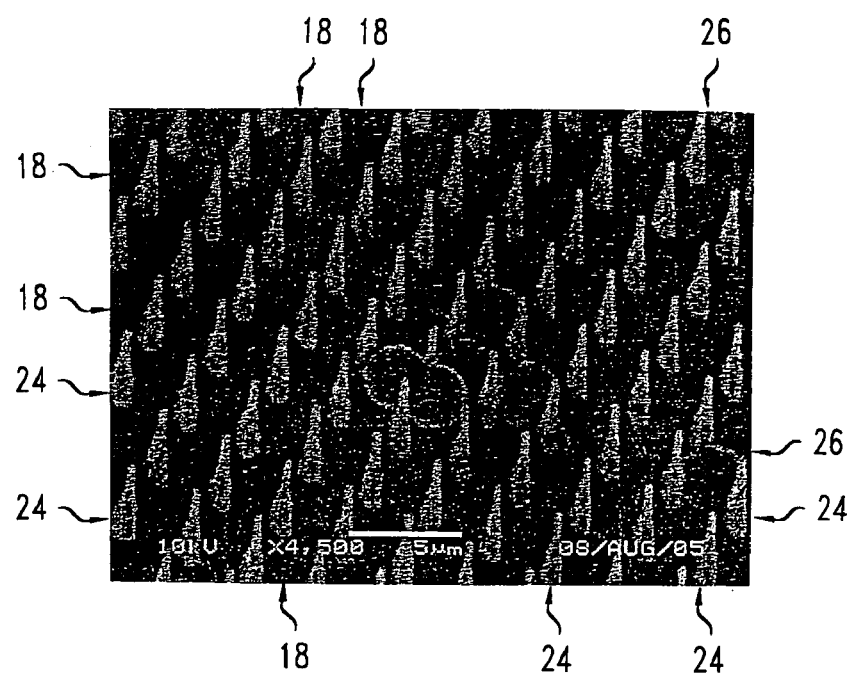
Figure 7C:
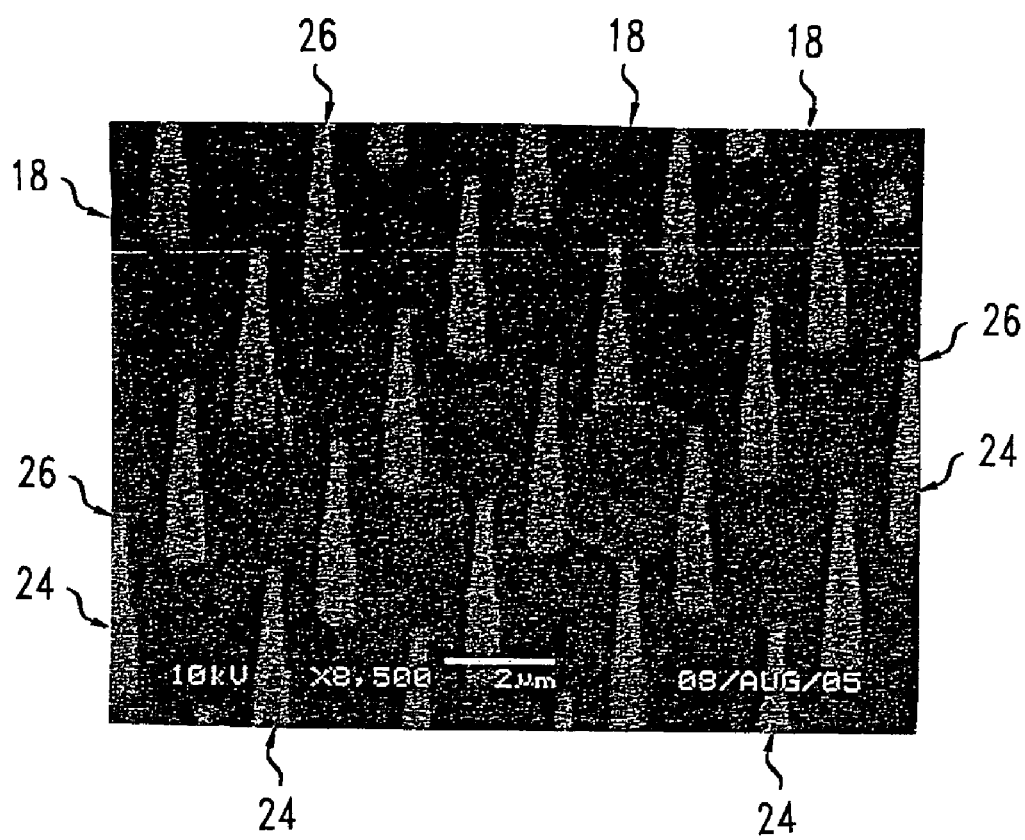

FIGS. 7A-7C show various layered structures made according to method 40 of FIG. 6, e.g., apparatus 10 of FIG. 1-2. In the micrographs of FIGS. 7A-C, the globular objects have known sizes and are not part of the fabricated layered structures. Instead, the globular structures were used to determine sizes of features on the layered structures.

In FIGS. 7A, 7B, and 7C, growth step 46 was performed using a starting solutions that had about 1 weight %, about 2 weight %, and about 4 weight %, respectively, of polymerization initiator molecules. For that reason, the polymerized layer of hydrogel is probably thickest in FIG. 7C and thinnest in FIG. 7A. Indeed, the micrographs show that lower portions of the post-like micro-structures 24 are thicker in FIGS. 7B and 7C. This thickening may be due to hydrogel located on the lower portions of the raised micro-structures.

From the disclosure, drawings, and claims, other embodiments of the invention will be apparent to those skilled in the art.

What we claimed is:

1. An apparatus, comprising:
a substrate having a top surface;
a substantially regular array of raised structures located over the top surface, distal surfaces of the structures being farther from the top surface than remaining portions of the structures;
a layer being located over the top surface and filling a portion of a volume between the structures, the layer being able to contract such that in a first state the distal surfaces of the structures protrude through the layer, the layer being able to swell such that in a second state the distal surfaces of the structures are closer to the top surface of the substrate than one surface of the layer; and wherein the raised structures form an effective surface on which a liquid is supported in the first state, and the layer forms an effective surface on which a liquid is to rest in the second state.

2. The apparatus of claim 1, wherein the one surface of the layer is chemically functionalized with antibodies, nucleic acid, or protein.

3. The apparatus of claim 1, wherein the one surface of the layer is chemically functionalized with molecules that change a wettability of the layer.

4. The apparatus of claim 1, wherein the one surface of the layer is coated with a fluorinated polymer.

5. The apparatus of claim 1, wherein the structures comprise one of posts, on-edge planes, and closed cells.

6. The apparatus of claim 1, further comprising an anchoring layer bonded to the substrate and the layer.

7. An apparatus, comprising:

a substrate having a top surface;

a substantially regular array of raised structures located over the top surface, distal surfaces of the structures being farther from the top surface than remaining portions of the structures;

a layer being located over the top surface and filling a portion of a volume between the structures, the layer being able to contract such that in a first state the distal surfaces of the structures protrude through the layer, the layer being able to swell such that in a second state the distal surfaces of the structures are closer to the top surface of the substrate than one surface of the layer; and wherein the raised structures form an effective surface on which a liquid is supported in the first state, and the layer forms an effective surface on which a liquid is to rest in the second state, and wherein the layer comprises a hydrogel.

* * * * *